US011700763B2

(12) United States Patent
Yu et al.

(10) Patent No.: US 11,700,763 B2
(45) Date of Patent: Jul. 11, 2023

(54) CURVED DISPLAY AND LIGHTING DEVICE BASED ON A MIURA-ORI STRUCTURE

(71) Applicant: The Hong Kong University of Science and Technology, Hong Kong (CN)

(72) Inventors: Hongyu Yu, Hong Kong (CN); Yang Deng, Hong Kong (CN)

(73) Assignee: THE HONG KONG UNIVERSITY OF SCIENCE AND TECHNOLOGY, Hong Kong (CN)

( * ) Notice: Subject to any disclaimer, the term of this patent is extended or adjusted under 35 U.S.C. 154(b) by 117 days.

(21) Appl. No.: 17/226,481

(22) Filed: Apr. 9, 2021

(65) Prior Publication Data

US 2021/0320269 A1   Oct. 14, 2021

Related U.S. Application Data

(60) Provisional application No. 63/100,966, filed on Apr. 10, 2020.

(51) Int. Cl.
*H10K 77/10* (2023.01)
*H10K 71/00* (2023.01)
*H01L 51/00* (2006.01)
*H01L 51/56* (2006.01)

(52) U.S. Cl.
CPC .......... *H01L 51/0097* (2013.01); *H01L 51/56* (2013.01)

(58) Field of Classification Search
None
See application file for complete search history.

(56) References Cited

U.S. PATENT DOCUMENTS

| 2015/0228916 A1* | 8/2015 | Bulovic | H01L 51/0097 |
| | | | 136/263 |
| 2016/0231784 A1 | 8/2016 | Yu et al. | |
| 2016/0327223 A1* | 11/2016 | Venk | H01L 27/153 |

(Continued)

FOREIGN PATENT DOCUMENTS

| CN | 106684571 A | 5/2017 |
| FR | 7324120 A | 2/1975 |
| JP | 3001875 U | 9/1994 |

OTHER PUBLICATIONS

Vervust, Thomas, et al. "Integration of Stretchable and Washable Electronic Modules for Smart Textile Applications." Journal of the Textile Institute, vol. 103, No. 10, 2012, pp. 1127-1138., https://doi.org/10.1080/00405000.2012.664866. (Year: 2012).*

(Continued)

*Primary Examiner* — J. E. Schoenholtz
(74) *Attorney, Agent, or Firm* — Leydig, Voit & Mayer, Ltd.

(57) ABSTRACT

A flexible display device that can conform to complex curved surfaces, and methods for manufacturing said display device, are disclosed herein. The display device utilizes a Miura-ori origami structure that, in a folded or at least partially folded configuration, is able to conform to complex curved surfaces. The Miura-ori structure involves folding a two-dimensional substrate in accordance with crease lines comprising a tessellation of parallelograms. Each cell of the tessellation pattern can include one or more luminous elements (LEDs, OLEDs, etc.) bonded to circuit elements embedded within the flexible substrate (e.g., Parylene-C).

20 Claims, 10 Drawing Sheets

(56) References Cited

U.S. PATENT DOCUMENTS

2018/0198009 A1* 7/2018 He .................. H01L 31/1876
2021/0352800 A1* 11/2021 Yu .................. H05K 1/032

OTHER PUBLICATIONS

SCS Parylene Properties', downloaded from URL <https://scscoatings.com/parylene-coatings/parylene-properties/> on Oct. 13, 2022. (Year: 2022).*

Gattas, Joseph M., et al., "Miura-Base Rigid Origami: Parameterizations of First-Level Derivative and piecewise Geometries", *J. Mech. Des.* 135(11), pp. 111011-1-111011-11 (Oct. 9, 2013).

Lin, Chun-Ho, et al., "Highly Deformable Origami Paper Photodetector Arrays", *ACS Nana*, vol. 11, pp. 10230-10235, (Sep. 2017).

Yasuga, Hiroki, et al., "An Origami-Structured Flexible Electronic Substrate with Faces Parallel to Target-of-Attachment Surfaces", *IEEE MEMS*, pp. 909-9120, (Jan. 18-22, 2020).

Fuchs, Alexandra, et al., "FoldWatch: Using Origami-Inspired Paper Prototypes to Explore the Extension of Output Space in Smartwatches", *ACM* ISBN/978-1-44503-6437, (Sep. 18, 2019).

Kinoshita, Y., "Origami tessellation Display: interaction techniques using origami-based deformable surfaces", *Extended Abstract on Human Factors in Computing Systems*, pp. 1837-1842, (2014).

Seifert, Dan, "Samsung Galaxy S10 Plus Review: the Anti-iPhone", retrieved from https://www.theverge.com/2019/3/1/1825446/samsung-galaxy-s on Apr. 23, 2021, (18 pages).

Kronfli, Basil, et al., "Hands on: Huawei Mate X Review", Oct. 23, 2019, retrieved from https://www.techradar.com/reviews/huawei-mate-x , on Apr. 23, 2021, (22 pages).

Campbell, Ian Carolos, "Samsung's follow up to the Z Fold 2 could be smaller, but maybe not in the dimension you want", Apr. 12, 2021, retrieved from http:www.theverge.com/2021/4/22380763/Samsung-folding on Apr. 23, 2021, (3 pages).

Chen, Yining, "Konka Launches Micro LED TVs "Smart Wall", Confronting Samsung" The Wall, Nov. 1, 2019, retrieved from http://www.tedinside.com/news/2019/11/konka_launches_micro. on Apr. 23, 2021. (2 pages).

Kim, Rak-Hwan, et al., "Transparent Graphene Interconnects for Array of Microscale Inorganic Light Emitting Diodes n Rubber Substrates", *Nano Letters*, vol. 11, pp. 3881-3886 (2011).

Kim, Tae-Ho, et al, "Full-color quantum dot displays fabricated by transfer printing", *Nature Photonics*, vol. 5, pp. 176-182, (Mar. 2011).

Lee, Giwon, et al., "Omindirectionally and Highly Stretchable Conductive Electrodes Based on Noncoplanar Zigzag Mesh Silver Nanowire Arrays", *Advanced Electronic Materials*, vol. 2, 1600158, 6 pages total, (2016).

Kim, Rak-Hwan, et al., "Waterproof AllnGaP opoelectronics n stretchable substrates with applications in biomedicine and robotics", *Nature Materials*, vol. 9, pp. 929-937, (Nov. 2010).

Hong, Jong-Ho, et al., "9.1-inch stretchable AMOLED display based on LTPS technology", *Journal of the SID*, vol. 25, No. 3, pp. 194-199 (2017).

Larson, C., et al., "Highly stretchable electroluminescent skin for optical signaling and tactile sensing", *Science*, vol. 351, Issue 6277, pp. 1071-1074 (Mar. 4, 2016).

Steudel, Soeren, et al., "Design and realization of a flexible QQVGA AMOLED display with organic TFts", *Organic Electronics*, vol. 13, pp. 1729-1735 (2012).

Atchison, D.A., et al., "Optics of the human eye", (vol. 35), *Oxford: Butterworth-Heinemann*, (2000), citing "The retina" on pp. 5-7, Table 1.1 on p. 6, and the"Field of vision" on p. 8 and "Purpose of the pupillary light response" on p. 27.

* cited by examiner

CURVED DISPLAY AND LIGHTING DEVICE BASED ON A MIURA-ORI STRUCTURE

CROSS-REFERENCE TO RELATED APPLICATIONS

This application claims priority to U.S. Provisional Application No. 63/100,966, filed on Apr. 10, 2020, which is hereby incorporated by reference in its entirety.

TECHNICAL FIELD

The application relates to display technology. More specifically, the application is directed to a curved display and lighting device.

BACKGROUND

Conventional display devices are widely used by both industrial and consumer applications, including televisions, computer monitors, smartphones, and smart watches, to name a few. However, due to limitations associated with the rigid structure of substrate materials used in conventional display devices, the acceptable applications for conventional display devices are significantly restricted. For example, conventional display devices cannot easily conform to a curved surface, be folded, or stretched.

Foldable displays are now utilized in some smartphone designs. The display device can be folded for saving space and convenience during storage and, when unfolded, the display provides a large screen size for providing a better user experience. A typical foldable display technology utilizes organic light emitting diode (OLED) technology. The organic characteristics of the material presents the ability to fabricate the OLED components on flexible substrates. The Samsung Galaxy S series is one example of an ° LED display that covers the edge of the phone. Foldable phones have been developed that benefit from advances in flexible thin film transistor (TFT) and flexible packaging technologies.

As a novel concept, stretchable or curved display devices were considered promising candidates for special applications, like exhibition of three-dimensional objects and light shows. Due to essential distinctions between stretchable or curved displays and foldable displays, the materials developed, fabrication techniques, and device designs can be different. In one example, a flexible and stretchable display is achieved by packaging light emitting diode (LED) chips with serpentine-shaped graphene interconnect (e.g., a two-dimensional nanomaterial suitable for transparent electrodes) on a PDMS (Polydimethylsiloxane) substrate. The serpentine design allowed for reversible linear elastic behavior under an applied strain of around 100%. Quantum dot (QD) emitters are regarded as a powerful candidate for next generation displays because of high color purity and quantum efficiency, suitable bandgap and spectral tenability via nanocrystal size control, and a wide color gamut. In another example, a flexible, full-color QD-LED display using patterned films of different color of QDs, which are packaged on a thin PEN (Polyethylene naphthalate) substrate through pick-and-place transfer printing.

Commonly, utilization of novel materials can require new fabrication techniques. A unique direct printing method is reported to pattern 40 μm silver nanowires (AgNW) as electrodes on a PDMS substrate for achieving a stretchable display. This technique illustrates that the display device could withstand tensile strains of up to 20% for more than 1000 cycles. Structure design is another promising method for achieving stretchable or curved devices, in contrast to using new materials and processes. Tiny rigid island structures, like in a serpentine shape, is one design approach for developing stretchable displays. A 6×6 stretchable LED array has been fabricated, where LEDs were transferred onto metal serpentine-shaped microribbons on biaxially prestrained elastomeric substrate. The serpentine microribbons deviated from the substrate and form non-coplanar pop-up bridges after releasing the prestrain so that the display device achieves approximately 48% stretchability. In another embodiment, a 32×32 AMLED stretchable display with horseshow-shaped metal interconnections has also been developed. That display device illustrates that the device designed in this fashion could endure substantial deformation when mounted on complexly shaped surfaces. In another example, a full-color AMOLED display packaged on a LTPS (low-temperature polycrystalline silicon) TFT backplane has been achieved that can be stretched into both concave and convex shapes without image degradation under 5% stretching. In another example, an 8×8 capacitor-type display driven by an alternating current (AC) electric field has been reportedly developed. The ZnS phosphors embedded in Eco-flex 00-30 emit light when an AC electric field is applied to two electrodes made in an elastomeric matrix (e.g., PAM-Polyacrylamide), in which LiCl is embedded as an ionic conductor. Such a device exhibits good performance when bent, folded, or rolled, and is enabled to fit curved surfaces.

Even given these examples, cutting edge display devices remain subject to a litany of issues that must be overcome. For example, the brightness of an OLED device is extremely sensitive to moisture and oxygen. Traditional manufacturing technology uses glass substrates to isolate the OLED devices. However, current flexible plastic substrates may exhibit reduced water and oxygen barrier properties when compared against a traditional glass substrate. Equipping OLEDs with barrier structures or other thin-film encapsulation technologies to achieve sealing and/or water resistance can increase manufacturing difficulty and production costs. LCD folding technology is not yet mature and some other technologies are only in the development stage Most stretchable or curved displays rely on a flexible substrate such as PDMS or Eco-flex to achieve a stretchable effect, but these materials can suffer from long-term fatigue and limited stiffness. This can result in low strength and reduced reliability under cyclic loads. More importantly, the use of these materials may prevent the display from being manufactured or deployed in a high-temperature environment, Other devices that rely on serpentine or horseshoe shaped structures may have limited deformation capability or can only be stretched uni-axially. In addition, due to the large size and spacing of each pixel, the subjective quality of the display device may be undesirable. Solutions to these issues are needed to develop new flexible curved displays.

SUMMARY

A display device and techniques for manufacture the display device are disclosed in the following detailed description. The display device includes a flexible substrate that is folded in accordance with an origami or kirigami folding technique. These types of three-dimensional structures can conform to complex surfaces, unlike traditional flexible display devices that are not easily adapted to stretch over anything more complex than a simple radius at, e.g., an edge of the screen or a bend point (in the case of folding screens).

In accordance with one aspect of the present disclosure, a display device is disclosed, the display device includes a flexible substrate and a plurality of luminous elements bonded to circuit elements embedded in the flexible substrate. The flexible substrate is folded into a three-dimensional structure in accordance with a folding pattern.

In some embodiments, the folding pattern comprises a tessellation of parallelograms, and each cell of the tessellation includes at least one luminous element.

In some embodiments, the flexible substrate comprises Parylene-C.

In some embodiments, the circuit elements include row electrodes and column electrodes, and the luminous elements comprise light emitting diodes. In other embodiments, the luminous elements comprise organic light emitting diodes.

In some embodiments, each chip included in a cell of a tessellation pattern is separately packaged by encapsulating the chip in a protective layer. In an embodiment, the protective layer comprises Parylene-C. In another embodiment, the protective layer comprises epoxy.

In some embodiments, the flexible substrate is encapsulated within a protective layer of poly dimethylsiloxane (PDMS).

In some embodiments, the three-dimensional structure is manipulated to conform to a curved surface and affixed thereto using at least one of an adhesive or mechanical fasteners. In an embodiment, the curved surface is a spherical surface. In another embodiment, the curved surface has a varying rate of curvature along at least one path that lies on the surface.

In yet another aspect of the present disclosure, a method is disclosed for manufacturing a flexible display device. The method includes the steps of: fabricating a two-dimensional substrate that includes circuit elements, folding the two-dimensional substrate into a three-dimensional structure, and conforming the three-dimensional substrate to a curved surface.

In some embodiments, fabricating the two-dimensional substrate includes: depositing a substrate layer on a wafer, forming the circuit elements on the substrate layer, wherein the circuit elements include metal interconnects, and depositing a top layer over the circuit elements.

In some embodiments, fabricating the two-dimensional substrate further includes: bonding a plurality of luminous elements with the circuit elements to form a plurality of chips on the substrate layer, and packaging each chip of the substrate layer with a protective material.

In some embodiments, the luminous elements comprise light emitting diodes (LEDs). The substrate layer and the protective material are Parylene-C.

In some embodiments, the three-dimensional structure comprises an origami or a kirigami structure.

In some embodiments, folding the two-dimensional substrate into the three-dimensional structure includes: folding the two-dimensional substrate based on a plurality of crease lines that form a tessellation of parallelograms.

In an embodiment, the curved surface has a varying rate of curvature along at least one path that lies on the surface.

In yet another aspect of the present disclosure, a method is disclosed for manufacturing a flexible display device. The method includes the steps of receiving a substrate having a three-dimensional origami structure; patterning circuits on the substrate with origami structure; bonding luminous elements to the circuits; and packaging the display device.

In some embodiments, the three-dimensional origami structure comprises a Miura-ori structure.

DETAILED DESCRIPTION

The present disclosure is directed to a flexible display device. Luminous elements are bonded to a two-dimensional substrate that, when folded into a three-dimensional Miura-ori origami structure, enables the display device to conform to complex curved surfaces due to the geometric nature of the origami structure. The substrate is a flexible film that can include, but is not limited to, Parylene-C, and the substrate may be formed on a silicon wafer. Circuit elements including metal interconnects are formed in the substrate and bonded to luminous elements using solder. Once the device is fabricated on the silicon wafer, the device can be separated from the wafer and folded into the Miura-ori structure before being placed on a curved surface.

Alternatively, the substrate and circuits can be formed and then removed from the wafer. The substrate can then be separated from the wafer and folded into the Miura-ori structure. The luminous elements are then bonded to the circuit elements while in the folded configuration. In some embodiments, the display device can be protected by a layer of Parylene-C or PDMS.

It will be appreciated that any type of small electronic device can be bonded to the surface of the Miura-ori structure and that the applications of the device are not limited to flexible displays. For example, ultraviolet LEDs can be bonded to the structure in order to provide for sterilization and/or medical treatment. Further, while the description below predominantly describes the embodiments with reference to a Miura-ori folding pattern invented by Koryo Miura circa 1993, other types of origami structures having even higher space utilization when folded are within the scope of the present disclosure. The type of folding pattern that is selected may be tailored to the application. For example, small wearable display devices for a watch that uses mini or micro LED elements might utilize a different style of folding pattern than a large outdoor screen that use much larger LED elements.

Figure 1A:
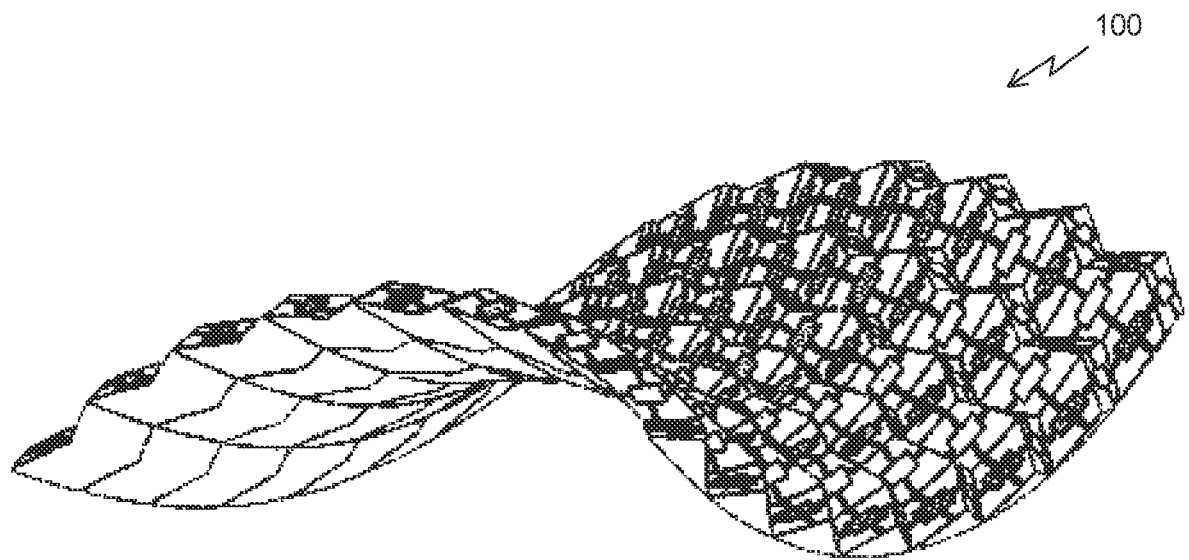
FIGS. 1A-1C illustrate a display device that conforms to a complex curved surface, in accordance with some embodiments.
Figure 1B:
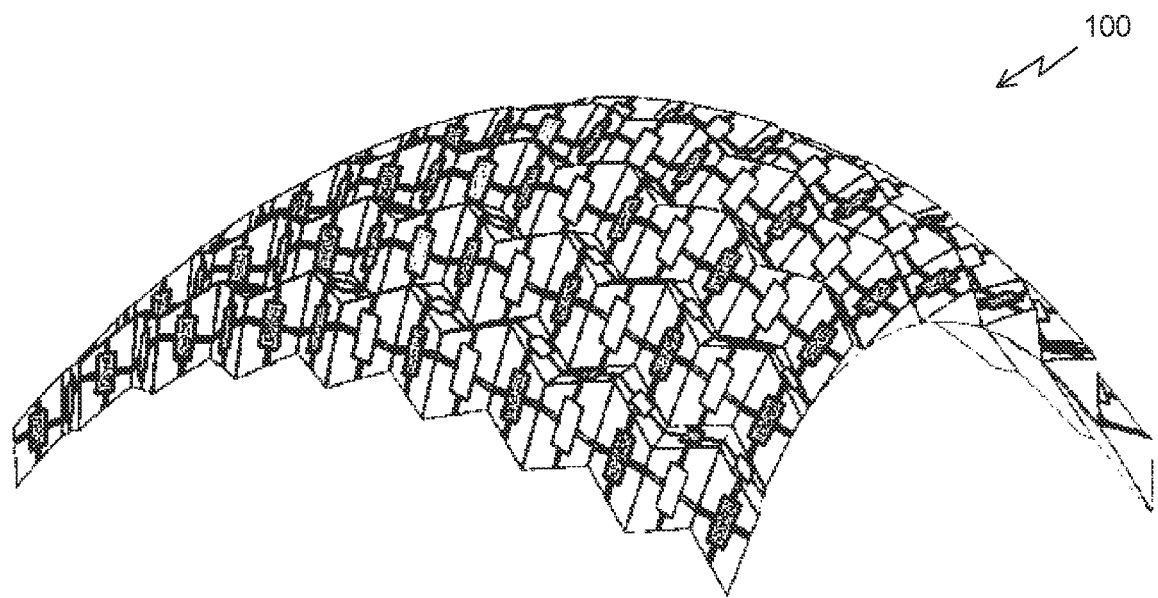
Figure 1C:
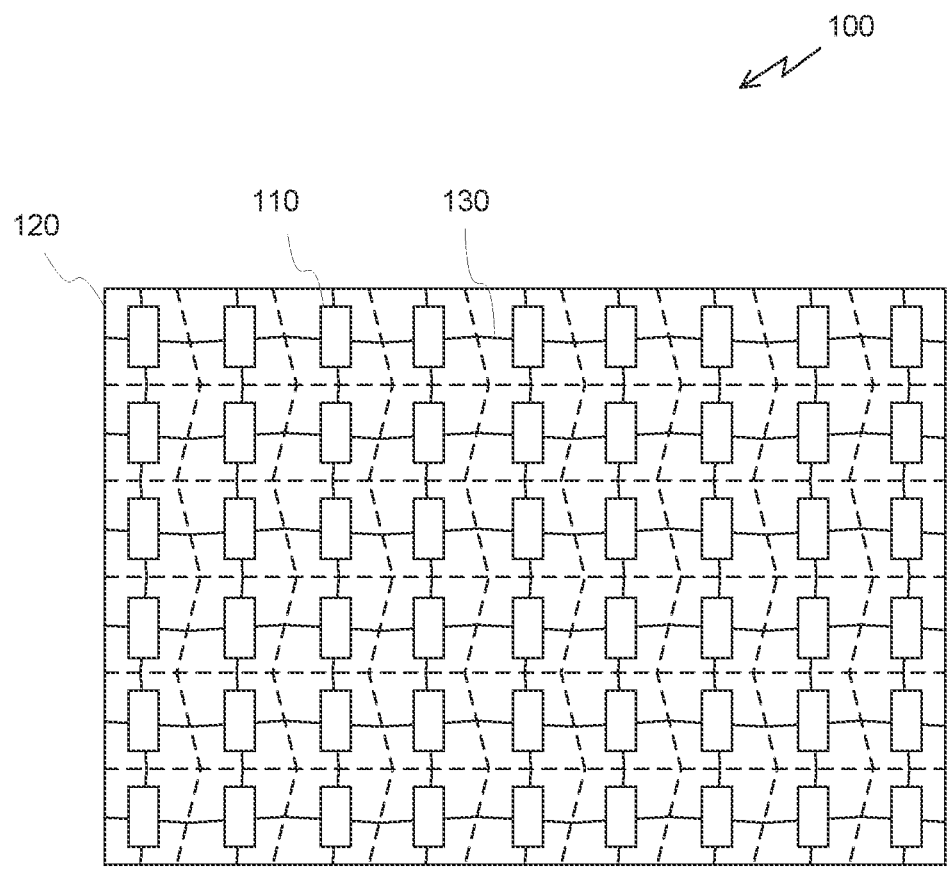

FIGS. 1A-1C illustrate a display device 100 that conforms to a complex curved surface, in accordance with some embodiments. As depicted in FIG. 1A, a display device 100 includes an array of luminous elements arranged on a three-dimensional structure. The structure includes a substrate that is folded along a number of crease lines. In some embodiments, the crease lines form a tessellation of parallelograms on a two-dimensional surface of the substrate that, when folded, form a series of peaks and valleys that can be referred to as a Miura fold or Miura-ori in Japanese. This type of pattern has been utilized in space applications to fold large flat structures to minimize a footprint of the structure in the payload of a rocket. For example, large solar panels have been designed in accordance with this pattern to enable the solar panel to be stowed inside a fairing of a rocket but allow for the panel to be expanded to many times the size of the rocket once deployed in space.

The Miura fold crease pattern allows for the three-dimensional structure to conform to complex curved surfaces as the included angle between any two parallelograms, when folded, can adapt to the rate of curvature of the surface, Consequently, the display device 100 can conform to a saddle surface, as depicted in FIG. 1A, or a spherical surface, as depicted in FIG. 1B. In some embodiments, the curved surface has a varying rate of curvature along at least one path that lies on the surface.

FIG. 1C illustrates the display device 100 in a flat configuration, in accordance with some embodiments. A tessellation of parallelograms is formed by the crease lines (shown as dashed lines) on a flat surface of a flexible substrate 120. The display device 100 includes a number of luminous elements 110 arranged in a pattern, with at least one luminous element included in each parallelogram of the tessellation. In an embodiment, the luminous element 110 is a light emitting diode (LED). In other embodiments, the luminous element 110 is an organic light emitting diode (OLED). The luminous element 110 can comprise a mini-LED or a micro-LED, referring to the size of the luminous element 110 compared to conventional LEDs. In some embodiments, the luminous element 110 can include quantum dots (QDs). It will be appreciated that the luminous elements 110 can be any light-emitting element capable of being fabricated on the substrate 120 or fabricated remotely and then bonded thereto.

Interconnects 130 are coupled to the luminous elements 110, In some embodiments, each luminous element 110 can be addressed by a row electrode and a column electrode. All of the luminous elements 110 in a particular row are connected to a common row electrode. Similarly, all of the luminous elements 110 in a particular column are connected to a common column electrode. Activating a single row electrode and a single column electrode selects a particular luminous element 110 in the array of luminous elements, enabling a signal to be sent to that particular luminous element 110 to activate the luminous element. Although only the row electrodes and column electrodes are depicted in FIG. 1C, it will be appreciated that additional signals can be routed to each luminous element 110 via additional interconnects 130 formed in the substrate.

The interconnects 130 can sometimes be referred to as circuits, which are comprised of metal or other conducting material formed in the substrate 120, In some embodiments, the circuits can also include other components, such as capacitors, resistors, or other common electrical or semiconductor devices.

In some embodiments, the substrate 120 is a sheet of Parylene-C, which is a common name for a polymer that includes benzenediyl rings ($C_6H_4$) connected by ethanediyl bridges ($CH_2$). The dense, flexible Parylene-C film can be manufactured via chemical vapor deposition (CVD) and can withstand high temperatures of approximately 200 degrees Celcius. Furthermore, the Parylene-C material is effective at forming a barrier against moisture and oxygen.

The Miura-ori structure has a unique characteristic of a negative Poisson's ratio and provides a significant degree of deformation when stretched (biaxially). These geometric properties of the three-dimensional structure allow the structure to conform to various curved surfaces. In addition, the size of the origami cells can be adapted across the structure to allow for uneven deformation to match irregular curved surfaces.

It will be appreciated that the number of luminous elements 110 included in each cell of the structure is not limited, and more than one luminous element 110 can be included in each cell of the tessellation. For example, in some embodiments, red, green, and blue LEDs can be included in each cell such that each cell forms a pixel of three primary colors. In other embodiments, each cell can include LEDs of a particular pattern. For example, each cell can include one red LED, one blue LED, and two green LEDs that form a Bayer pattern mosaic. In yet other embodiments, each call can include LEDs conforming to a CYGM patter (cyan, yellow, green, magenta) or a RGBE pattern (red, green, blue, emerald). In yet other embodiments, the number of luminous elements 110 included in each cell is based on a size of the cell and/or a curvature of the surface corresponding to the cell. For example, if the curvature of the surface is small in a particular area, then the peaks of the three-dimensional structure may be close together when the structure conforms to a surface. In such cases, fewer luminous elements may be included in the cell because the area between the peaks is smaller so the amount of light emitted from the corresponding valley can be reduced. Conversely, if the curvature of the surface is large, then the distance between peaks may be larger, and the number of luminous elements can be increased.

Figure 2:
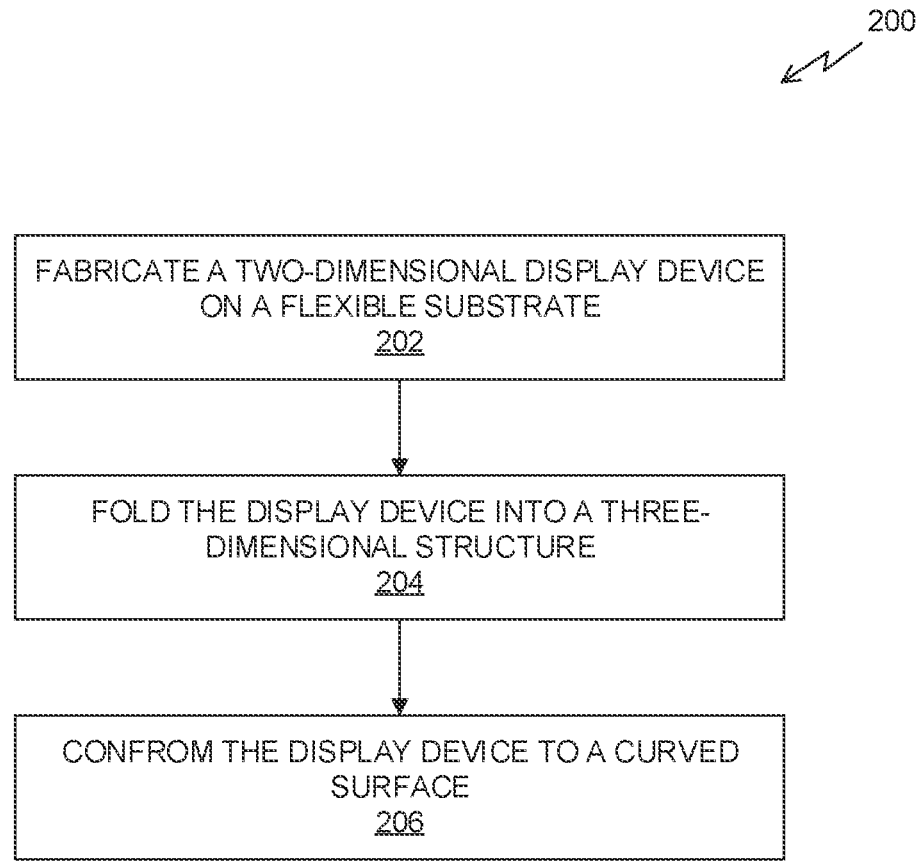
FIG. 2 is a flow diagram of a method for manufacturing a display device, in accordance with some embodiments.

FIG. 2 is a flow diagram of a method 200 for manufacturing a display device 100, in accordance with some embodiments. The method 200 can be performed by any number of automated tools for manufacturing a device. For example, the method 200, at least in part, can be performed by a machine that is configured to perform CVD in order to form a flexible substrate on a wafer. The method 200 can be performed in any number of steps using any number of different devices to form the display device 100.

At step 202, a two-dimensional display device 100 is formed on a flexible substrate. In an embodiment, the flexible substrate is a Parylene-C film. Interconnects including at least row electrodes and column electrodes are formed in the substrate. LEDs or other luminous elements are bonded to pads connected to the electrodes. The interconnects can be coupled to a controller that energizes the electrodes in order to cause the LEDs to emit light at different luminance values in order to form an image on the display device 100. In other embodiments, the substrate can be Polyimide, Parylene-D, or any other material that matches the requirements of a particular application.

At step 204, the display device 100 is folded into a three-dimensional structure. In some embodiments, the display device 100 is folded along a plurality of crease lines that form a tessellation of parallelograms referred to as a Miura-ori structure. In some embodiments, the two-dimensional display device 100 is placed on a mold and each row of parallelograms is formed to the mold in sequence in order to crease the display device 100 at the crease lines. It will be appreciated that any technique for folding the two-dimensional sheet of luminous elements 110 is within the scope of this disclosure. In other embodiments, the display device 100 is folded into other types of origami or kirigami structures and is not limited to a Miura-ori type structure.

At step 206, the display device 100 is conformed to a curved surface. Once the display device 100 has been folded into the Miura-ori three-dimensional structure, the display device can be formed to a curved surface such as a saddle, sphere, column, or any other irregular or complex surface. In some embodiments, a back side of the display device, opposite the luminous elements 110, is bonded to the surface, such as using an epoxy or other type of adhesive. It will be appreciated that the back side of the display device 100 may only contact the curved surface at the tip of the valleys formed in the Miura-ori structure. As long as the substrate 120 is flexible, the area of contact may be large enough to provide sufficient tensile strength to hold the display device 100 on the surface. If the substrate is more rigid, then an adhesive that expands to fills the gaps between the adjacent faces of the cells may be used to bond the display device 100 to the curved surface. In other embodiments, the display device 100 may be mechanically affixed to the surface, such as with the use of mechanical fasteners.

Figure 3:
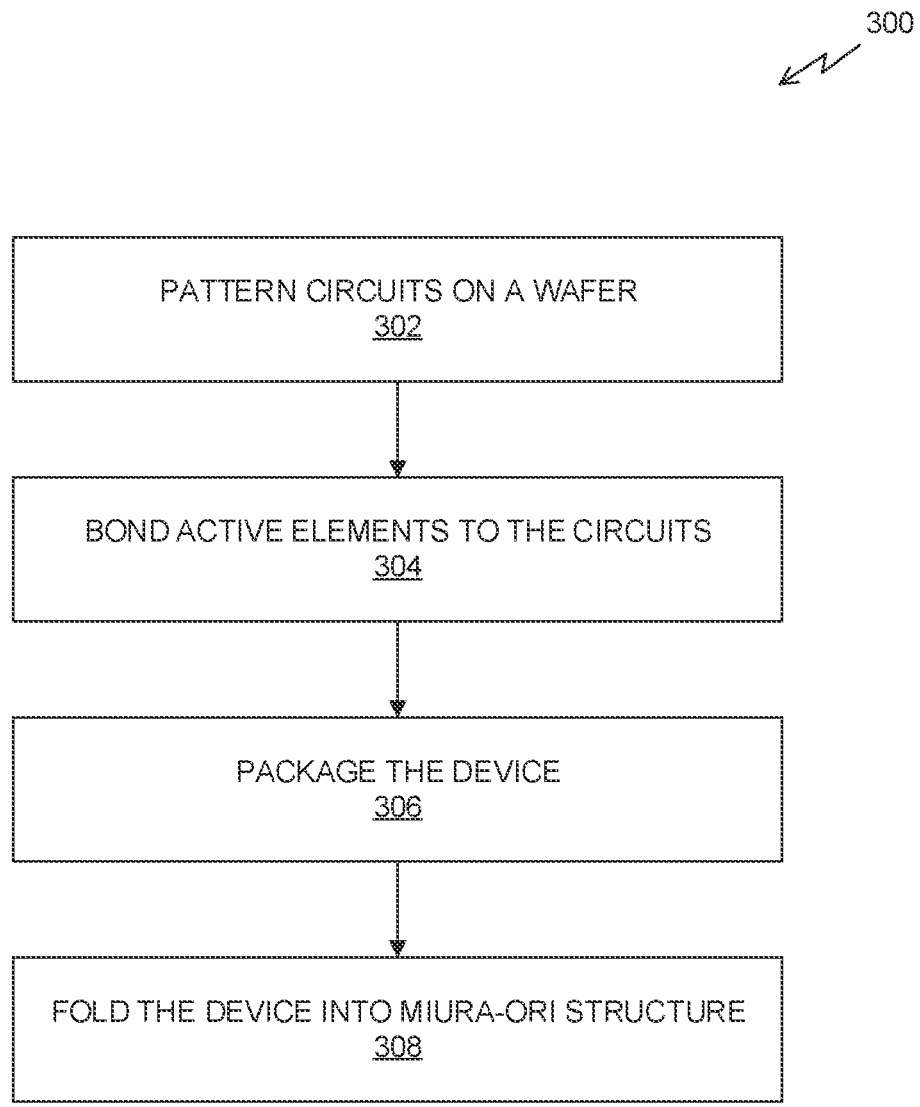
FIG. 3 is a flow diagram of a method for manufacturing a display device, in accordance with an embodiment.

FIG. 3 is a flow diagram of a method 300 for manufacturing a display device 100, in accordance with an embodiment. The method 300 can be performed by any number of automated tools for manufacturing a device. For example, the method 300, at least in part, can be performed using conventional semiconductor processes and techniques.

At step 302, circuits are patterned on a wafer. In an embodiment, a substrate 120 is deposited on a surface of a silicon wafer. The substrate 120 can be, e.g., a Parylene-C or other type of flexible polymer that exhibits characteristics suitable for forming circuits therein. The circuits may be created by forming a metal layer on the substrate and etching the metal layer to remove portions of the metal to reveal the set of interconnects 130 on the substrate 120. The circuits can be encapsulated in a top layer of Parylene-C, and pads are formed in the top layer by removing areas of the top layer to reveal the electrodes underneath the top layer.

At step 304, active elements are bonded to the circuits. In an embodiment, the active elements are luminous elements 110, such as LEDs, OLEDs, or the like. The luminous elements 110 can be bonded to the electrodes using solder halls on the bottom of the luminous elements 110. The luminous elements 110 can be placed on the solder balls and heated until the solder flows connecting the luminous elements 110 to the electrodes embedded in the substrate. In an embodiment, a pick and place machine can be used to place the luminous elements 110 on the substrate formed on the wafer.

It will be appreciated that the present disclosure describes a curved display device 100 implemented using a Miura-ori structure. However, in other embodiments, the active elements attached to each cell can be other types of devices or sensors. For example, the active elements can include image sensors (CMOS or CCD type), capacitive sensors, temperature sensors, or the like. This can allow a sensor to be made that conforms to a complex curved surface rather than a traditional flat surface. The scope of the present disclosure is not limited only to light-emitting devices.

For example, other implementations of the concept described herein include disposing thermoelectric cooler chips on a Miura-ori structure that can be conformed to a curved surface in order to facilitate heat dissipation (e.g., by cooling the surface). In other embodiments, chips or sensors with different functions such as thermometry, hygrometry, flow gauging, or the like can be integrated with Miura-ori structures to map temperature, humidity, or flow velocity at or near a curved surface.

At step 306, the device is packaged. In an embodiment, the active elements can be encapsulated in an epoxy or other material to protect the elements from oxygen, moisture, or other types of liquids or gases. In an embodiment, the wafer is covered in a top layer of Parylene-C, which is transparent in the visible spectrum, to completely encapsulate the luminous elements 110.

At step 308, the device is folded into a Miura-ori three-dimensional structure. Step 308 can be accomplished as described in step 206, set forth above.

Figure 4A:
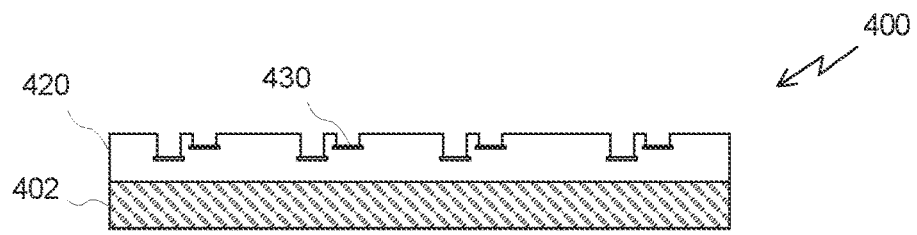
FIGS. 4A-4D illustrate the process of manufacturing the display device, in accordance with some embodiments.

FIGS. 4A-4D illustrate the process of manufacturing the display device 100, in accordance with some embodiments. As shown in FIG. 4A, a wafer a Silicon wafer) is processed to deposit a substrate layer 420. Circuits 430 are formed therein and the circuits are encapsulated in an additional substrate layer. Pads can be formed in the substrate 420 to expose electrodes included in the circuits 430.

Figure 4B:
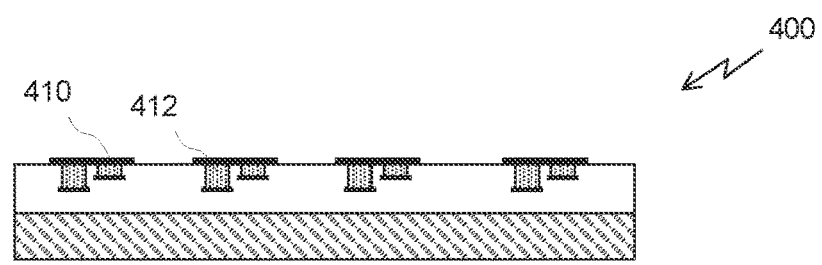

As depicted in FIG. 4B, luminous elements 410 are connected to the circuits via solder 412. In some embodiments, the luminous elements 410 are replaced with other type of active elements such as sensors. It will be appreciated that, although only two contacts are shown for each luminous elements, the number of contacts can be increased as required by a specific active element. For example, any standard package used for integrated circuit components can be bonded to the circuits.

Figure 4C:
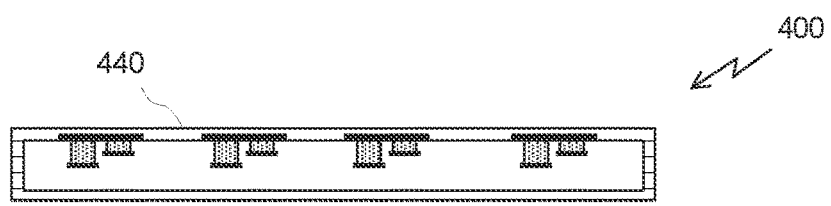

As depicted in FIG. 4C, the device 400 can be encapsulated in a protective layer 440, such as Parylene-C or other type of flexible polymer. In some embodiments, the protective layer is transparent such that the color of the luminous element 410 can be transmitted through the protective layer 440. In other embodiments, the protective layer can exhibit other characteristics such as absorbing certain frequencies of light. In some embodiments, such as applications where the active elements are sensors that do not work based on light transmission, then protective layer 440 can be opaque.

Figure 4D:
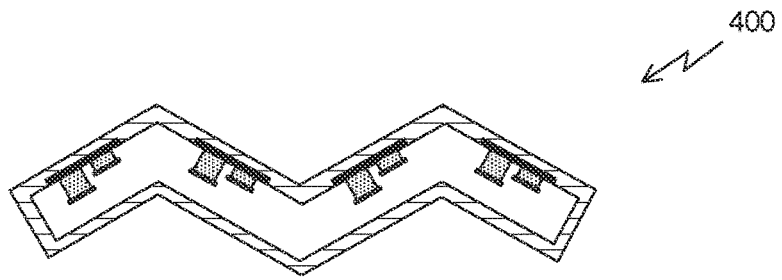

As depicted in FIG. 4D, the device 400 is folded into the Miura-ori structure. Although not shown in FIG. 4D, it will be appreciated that, in some embodiments, portions of the substrate 420 and/or protective layer 440 can be removed proximate the crease lines to reduce the rigidity of the device 400 at the crease lines. By making the device 400 thinner in these locations, strain in the substrate caused by the fold can be reduced.

Figure 5A:
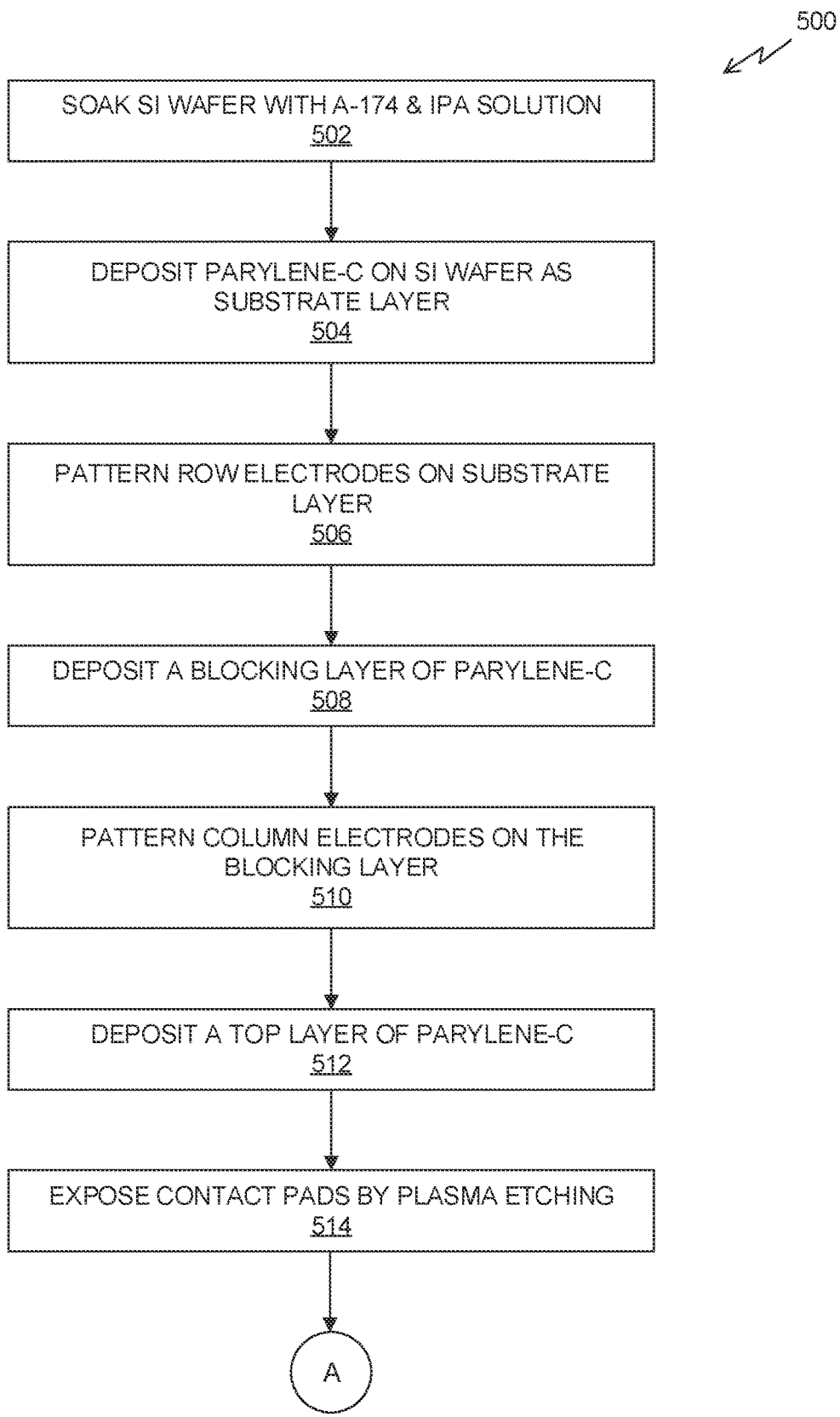
FIGS. 5A-5B illustrate a flow diagram of a method for manufacturing a display device 100, in accordance with some embodiments.
Figure 5B:
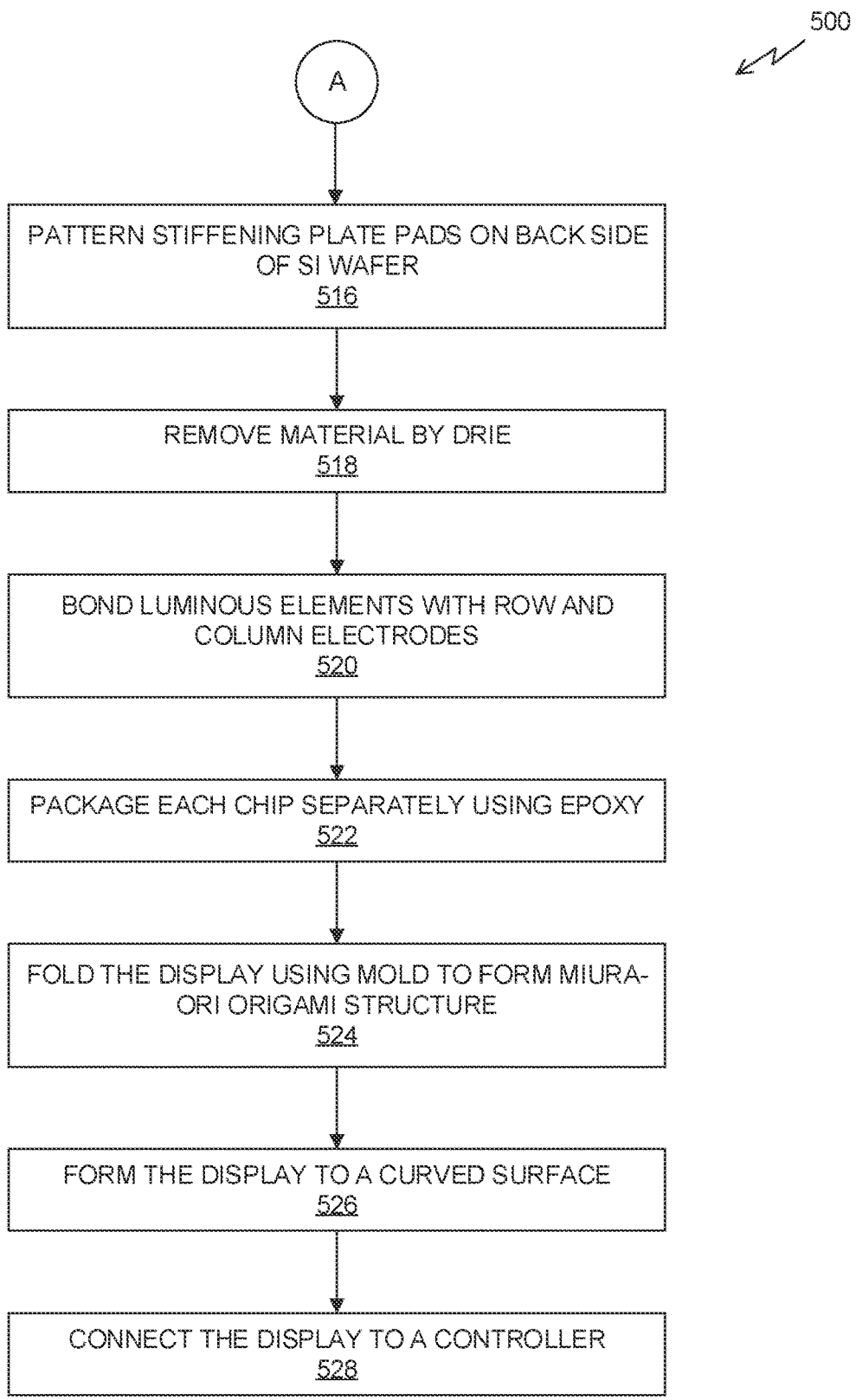

FIGS. 5A-5B illustrate a flow diagram of a method 500 for manufacturing a display device 100, in accordance with some embodiments. The method 500 is merely one technique for manufacturing a display device 100 in a two-dimensional film formed on a wafer. After the device is formed, the film is removed from the wafer and folded into the three-dimensional structure that enables the device to conform to a curved surface.

At step 502, a silicon wafer is soaked with an adhesion promoter (e.g., A-174 silane) & isopropyl alcohol solution to prepare the surface of the wafer. At step 504, a flexible polymer (e.g., Parylene-C) is deposited on the wafer as a substrate layer. At step 506, row electrodes are patterned on the substrate layer. In an embodiment, a metal layer is formed on the substrate, a photoresist film is deposited on the metal layer, and the photoresist film is patterned by exposing portions of the photoresists layer to an image of the row electrodes. The photoresist layer and metal layer are etched to form the row electrodes in the metal layer and the remaining photoresist is then removed from the surface of the device.

At step 508, a blocking layer of the flexible polymer is deposited on top of the row electrodes. At step 510, column electrodes are patterned on the blocking layer. The column electrodes may be formed in a similar manner to the row electrodes, as described above. At step 512, a top layer of Parylene-C is deposited on the column electrodes. At step 514, contact pads are formed by exposing a portion of the row electrodes and the column electrodes through the top layer. The contact pads can be formed via plasma etching.

At step 516, stiffening plate pads can be formed by patterning a back surface of the silicon wafer. The stiffening pads can provide additional rigidity in each cell of the tessellation pattern. The additional rigidity may protect a non-deformable device such as an integrated circuit by resisting bending in the area of the stiffening plate. Further, the negative space between stiffening plate pads make folding the substrate into the origami structure easier.

At step 518, material is removed by DRIE (deep reactive-ion etching). At least a portion of the wafer is removed by etching the wafer from the back side to form the stiffening plate pads. In some embodiments, the silicon wafer is etched to expose the substrate (e.g., the Parylene-C layer) from the backside of the wafer. In other embodiments, stiffening plate pads can be omitted and the substrate can be separated from the wafer by any technically feasible means including, but not limited to, etching, delamination, or mechanical abrasion.

At step 520, luminous elements are bonded with the row electrodes and the column electrodes. In one embodiment, the luminous elements can be bonded to the electrodes using solder. In other embodiments, active elements can be bonded to the exposed pads by any technically feasible means, including wire bonding, ultrasonic welding, or the like. At step 522, each chip is packaged separately using epoxy. As used herein, a chip can refer to one or more active elements deposited on a particular cell of the tessellation pattern formed in the substrate.

At step 524, the display device is folded using a mold to form the Miura-ori origami structure. In some embodiments, the display device can be folded manually while, in other embodiments, the device can be folded automatically by a machine.

At step 526, the display device is formed to a curved surface. Forming the display device to the curved surface can include placing the display device in a folded configuration on the surface and manipulating the distance between peaks in the three-dimensional structure. In some embodiments, an adhesive is used to bond the display device to the curved surface. In other embodiments, mechanical fasteners are used to secure the display device to the curved surface.

At step 528, the display device is connected to a controller. In an embodiment, the controller is connected to the row electrodes and the column electrodes in order to control activation of each individual luminous element separately. Of course, the controller can also control any single row or any single column collectively as well as two or more rows and two or more columns by activating multiple row or column electrodes simultaneously. Any technically feasible manner for controlling the active elements of the display device is contemplated as being within the scope of the present disclosure. In some embodiments, the controller can include a timing controller connected to one or more row drivers and one or more column drivers. The controller can also be connected to an interface for receiving video signals from, for example, a host processor, a graphics processing unit, or the like. The interface can be any common video interface including a high-definition multimedia interface (HDMI) interface, a display port (DP) interface, or the like. The interface can also be proprietary and is not restricted to conform to a widely used standard.

Figure 6:
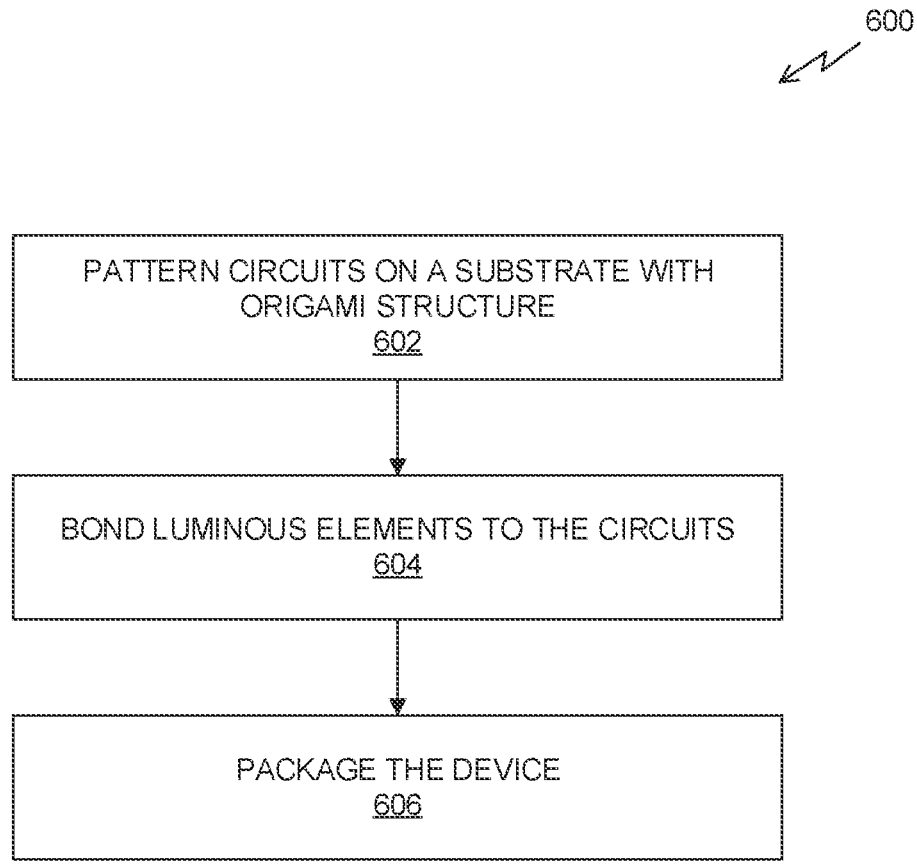
FIG. 6 is a flow diagram of a method for manufacturing a display device, in accordance with another embodiment.

FIG. 6 is a flow diagram of a method 600 for manufacturing a display device 100, in accordance with another embodiment. The method 600 can be performed by any number of automated tools for manufacturing a device. The method 600 differs from the method 300 in that the flexible substrate is received in the folded (i.e., three-dimensional) configuration prior to forming the circuits therein.

At step 602, circuits are patterned on a substrate. In an embodiment, the substrate can be manipulated into an unfolded (i.e., two-dimensional) configuration in order to pattern the circuits on a top surface of the substrate. In such embodiments, the substrate can be bonded to a rigid support structure such as a wafer or otherwise secured (e.g., via vacuum) to a rigid support structure during the process of forming the circuits in the substrate. It will be appreciated that, because the substrate has already been folded into a three-dimensional Miura-ori pattern, the location of the crease lines is known and the location of the circuits formed in the substrate should be registered relative to the location of the tessellation pattern formed therein.

In other embodiments, the circuit elements can be patterned on the substrate in a folded configuration (or at least partially folded). In this process, a glass mask or shadow mask can be used for circuit patterning similar to the method used in the unfolded configuration. In an embodiment, the substrate can be bonded onto the rigid support structure via a highly viscous and curable epoxy resin or elastomer, such as PDMS, Ecoflex (e.g., platinum-catalyzed silicones), or the like.

At step 604, the luminous elements are bonded to the circuits. In some embodiments, the luminous elements are bonded to the circuits in a folded configuration. In other embodiments, the luminous elements are bonded to the circuits in an unfolded configuration.

At step 606, the device is packaged. Each chip may be packaged separately. In an embodiment, the packaging process is performed with die bonders having additional degrees of freedom (e.g., 6 or more) that allow the die to be placed at any orientation on the surface of a folded structure. For example, the die bonder may include rotatable vacuum needles that can be used to locate the luminous elements on the substrate circuits in a folded configuration. Alternatively, the display device can be conformed to a curved surface and the display device can be encapsulated in a protective layer of Parylene-C or PDMS.

Figure 7A:
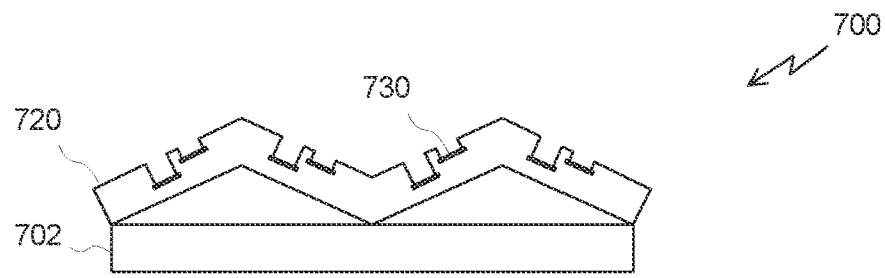
FIGS. 7A-7E illustrate the process of manufacturing the display device, in accordance with some embodiments.

FIGS. 7A-7E illustrate the process of manufacturing the display device 700, in accordance with some embodiments. As depicted in FIG. 7A, the substrate 720 and circuits 730, having been formed in the substrate in an unfolded configuration, are then folded and attached to a rigid support structure 702 in a folded configuration. Again, the folded substrate can be attached to the rigid support structure 702 using a viscous epoxy resin or other type of curable elastomer. In an embodiment, the folded structure can be embedded in an epoxy resin that is spin-coated on the wafer surface. In some embodiments, the rigid support structure 702 is a curved surface that is designed to simulate the surface where the display device 700 will be mounted.

Figure 7B:
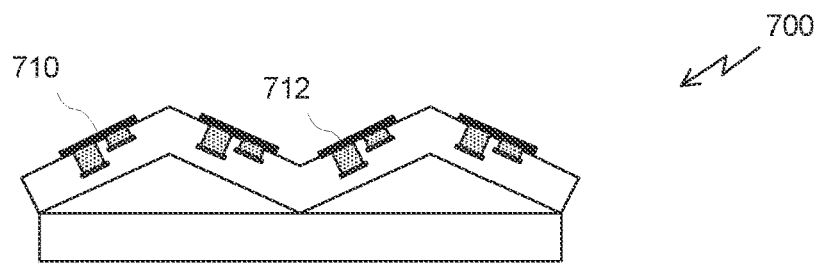

As depicted in FIG. 7B, luminous elements 710 are bonded to the circuits 730. In an embodiment, the luminous elements are LEDs, which are bonded to row electrodes and columns electrodes using solder 712.

Figure 7C:
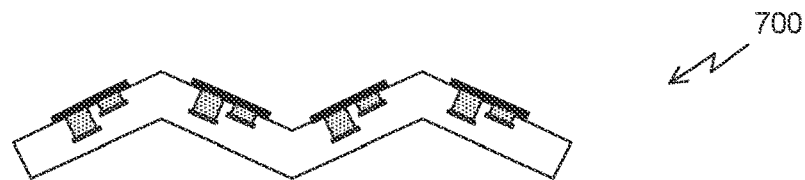
Figure 7D:
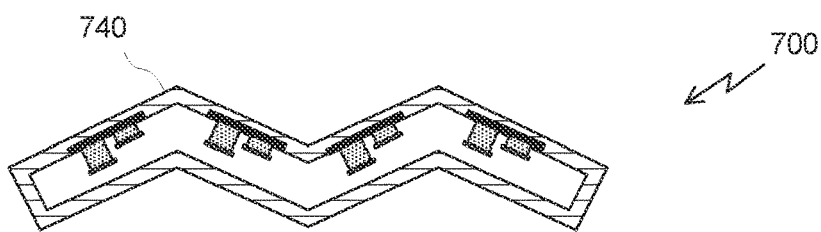
Figure 7E:
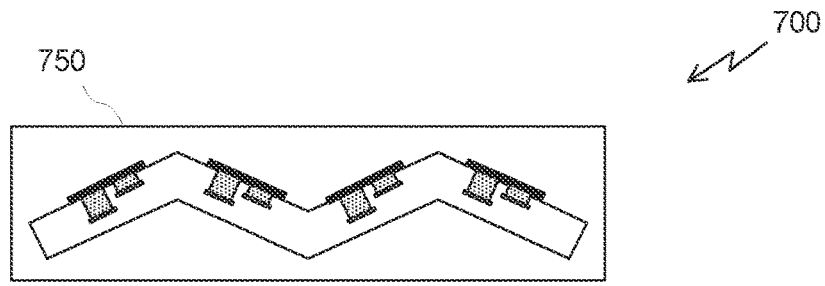

As depicted in FIG. 7C, the display device 700 is then removed from the rigid support structure. As depicted in FIG. 7D, each chip is packaged by encapsulating the chip in a protective layer 740 of Parylene-C. In other embodiments, as depicted in FIG. 7E, the display device 700 is packaged by encapsulating the entire display device 700 in a protective layer 750 of PDMS.

Figure 8:
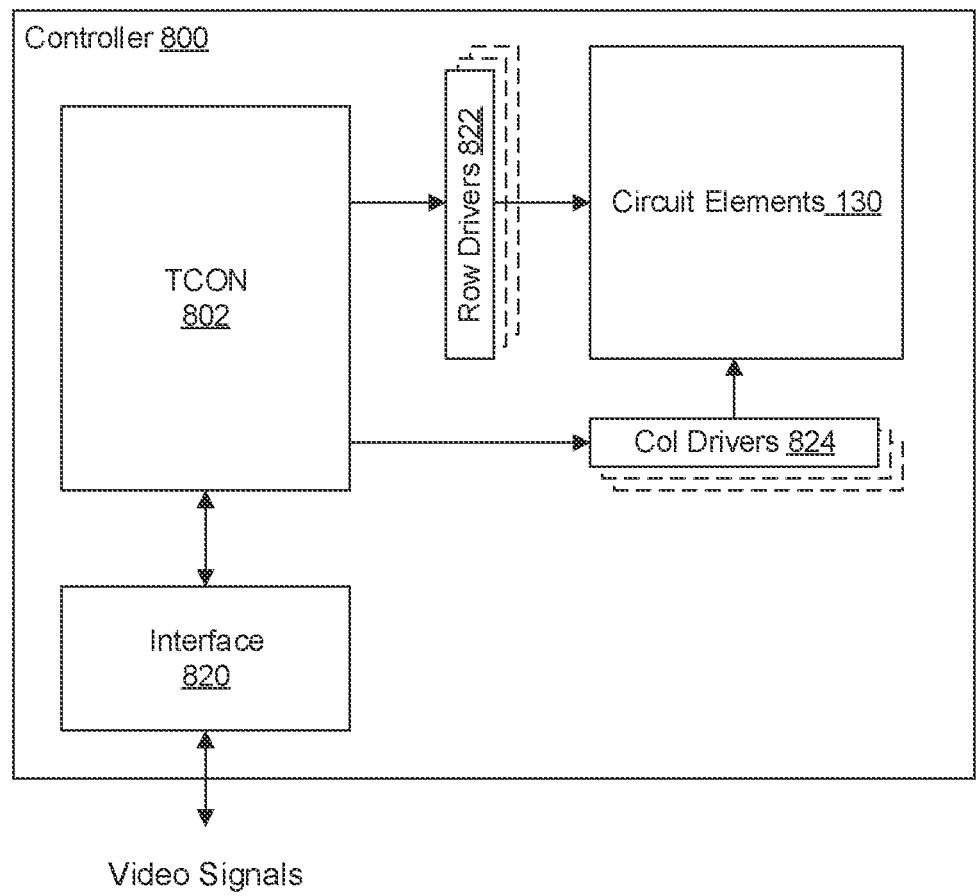
FIG. 8 illustrates an exemplary controller, in accordance with some embodiments.

FIG. 8 illustrates an exemplary controller 800, in accordance with some embodiments. The controller 800 includes a timing controller (TCON) 802, row drivers 822, column drivers 824, and a video interface 820. The TCON 802 receives video signals and processes the video signals to generate control signals for one or more row drivers 822 and one or more column drivers 824. The row drivers 822 and the column drivers 824 includes elements that drive signals connected to the circuit elements 130 such as the row electrodes and column electrodes coupled to the luminous elements 110. The row drivers 822 and column drivers 824 can include amplifiers and/or latch circuits. Although not shown explicitly, the ICON 802 can also generate a clock signal that indicates a refresh frequency of the display device, Where each luminous element is updated once per refresh cycle.

The interface 820 can be any common video interface including, but not limited to, HDMI, DP, eDP, VGA, and the like. In some embodiments, the interface 820 translates the video signal into raw image data used to update the display device 100.

Although not shown explicitly, the controller 800 can include additional processing units (e.g., a microcontroller, processor, digital signal processor (DSP), etc.) capable of processing instructions for performing various functions, such as applying filters to the video signals or updating the display device using a variable refresh frequency. In some embodiments, the controller 800 can also include memory for storing, e.g., image information that can be used to update the luminous elements 110. For example, the display device can store image data that can be used to update the image displayed by the display device 100 even when new image data is not receiving at the interface 820.

It will be appreciated that the controller 800 is merely one exemplary architecture and that the controller 800 can include various modifications such as additional components in lieu of or in addition to the components shown in FIG. 8.

Although not shown explicitly in FIG. 8, the video signals can be generated by an external host computer. In some embodiments, the host computer generates video signals via a CPU. In other embodiments, the host computer generates video signals via a CPU and one or more GPUs. The video signals can be generated by the host computer by decoding a video bitstream. Alternatively, the video signals can be generated by the host computer using a rendering algorithm. Any technically feasible manner of generating video signals for transmission to the display device is contemplated as being within the scope of the present disclosure.

It is noted that the techniques described herein may be embodied in executable instructions stored in a computer readable medium for use by or in connection with a processor-based instruction execution machine, system, apparatus, or device. It will be appreciated by those skilled in the art that, for some embodiments, various types of computer-readable media can be included for storing data. As used herein, a "computer-readable medium" includes one or more of any suitable media for storing the executable instructions of a computer program such that the instruction execution machine, system, apparatus, or device may read (or fetch) the instructions from the computer-readable medium and execute the instructions for carrying out the described embodiments. Suitable storage formats include one or more of an electronic, magnetic, optical, and electromagnetic format. A non-exhaustive list of conventional exemplary computer-readable medium includes: a portable computer diskette; a random-access memory (RAM), a read-only memory (ROM); an erasable programmable read only memory (EPROM); a flash memory device; and optical storage devices, including a portable compact disc (CD), a portable digital video disc (DVD), and the like.

It should be understood that the arrangement of components illustrated in the attached Figures are for illustrative purposes and that other arrangements are possible. For example, one or more of the elements described herein may be realized, in whole or in part, as an electronic hardware component. Other elements may be implemented in software, hardware, or a combination of software and hardware. Moreover, some or all of these other elements may be combined, some may be omitted altogether, and additional components may be added while still achieving the functionality described herein. Thus, the subject matter described herein may be embodied in many different variations, and all such variations are contemplated to be within the scope of the claims.

To facilitate an understanding of the subject matter described herein, many aspects are described in terms of sequences of actions. It will be recognized by those skilled in the art that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar references in the context of describing the subject matter (particularly in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. Furthermore, the foregoing description is for the purpose of illustration only, and not for the purpose of limitation, as the scope of protection sought is defined by the claims as set forth hereinafter together with any equivalents thereof. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the embodiments as claimed.

What is claimed is:

1. A display device, comprising:
    a flexible substrate including circuit elements embedded therein; and
    a plurality of luminous elements bonded to the circuit elements,
    wherein the flexible substrate is folded into a three-dimensional structure in accordance with a folding pattern,
    wherein the three-dimensional structure is manipulated to conform to a curved surface.

2. The flexible display device of claim 1, wherein the folding pattern comprises a tessellation of parallelograms, and wherein each cell of the tessellation includes at least one luminous element.

3. The flexible display device of claim 1, wherein the flexible substrate comprises Parylene-C.

4. The flexible display device of claim 1, wherein the circuit elements include row electrodes and column electrodes, and wherein the luminous elements comprise light emitting diodes.

5. The flexible display device of claim 1, wherein the luminous elements comprise organic light emitting diodes.

6. The flexible display device of claim 1, wherein each chip included in a cell of a tessellation pattern is separately packaged by encapsulating the chip in a protective layer.

7. The flexible display device of claim 6, wherein the protective layer comprises Parylene-C.

8. The flexible display device of claim 1, wherein the flexible substrate is encapsulated within a protective layer of polydimethylsiloxane (PDMS).

9. The flexible display device of claim 1, wherein the three-dimensional structure is affixed to the curved surface using at least one of an adhesive, epoxy resin, curable elastomer, or mechanical fasteners.

10. The flexible display device of claim 9, wherein the curved surface is a spherical surface.

11. The flexible display device of claim 9, wherein the curved surface has a varying rate of curvature along at least one path that lies on the surface.

12. A method for manufacturing a flexible display device, the method comprising:
    fabricating a two-dimensional substrate that includes circuit elements;
    folding the two-dimensional substrate into a three-dimensional structure; and
    conforming the three-dimensional structure to a curved surface in a folded configuration.

13. The method of claim 12, wherein fabricating the two-dimensional substrate comprises:
    depositing a substrate layer on a wafer;
    forming the circuit elements on the substrate layer, wherein the circuit elements include metal interconnects;
    depositing a top layer over the circuit elements.

14. The method of claim 13, wherein fabricating the two-dimensional substrate further comprises:
    bonding a plurality of luminous elements with the circuit elements to form a plurality of chips on the substrate layer; and
    packaging each chip of the substrate layer with a protective material.

15. The method of claim 14, wherein the luminous elements comprise light emitting diodes (LEDs), the substrate layer comprises Parylene-C, and the protective material is Parylene-C.

16. The method of claim 12, wherein the three-dimensional structure comprises an origami or a kirigami structure.

17. The method of claim 12, wherein folding the two-dimensional substrate into the three-dimensional structure comprises folding the two-dimensional substrate based on a plurality of crease lines that form a tessellation of parallelograms.

18. The method of claim 12, wherein the curved surface has a varying rate of curvature along at least one path that lies on the surface.

19. A method for manufacturing a flexible display device, the method comprising:
    receiving a substrate having a three-dimensional origami structure;
    patterning circuits on the substrate with the three-dimensional origami structure in a folded configuration;
    bonding luminous elements to the circuits; and
    packaging the display device.

20. The method of claim 19, wherein the three-dimensional origami structure comprises a Miura-ori structure.

* * * * *